United States Patent [19]

Young

[11] Patent Number: 4,675,785
[45] Date of Patent: Jun. 23, 1987

[54] HEAT DISTRIBUTING DIODE MOUNTING ASSEMBLY

[75] Inventor: Thomas A. Young, Oak Hill, W. Va.

[73] Assignee: Hubbell Incorporated, Orange, Conn.

[21] Appl. No.: 891,288

[22] Filed: Jul. 31, 1986

[51] Int. Cl.⁴ .............................................. H05K 7/20
[52] U.S. Cl. ................................ 361/386; 165/104.33; 174/15 HD; 357/81; 363/144
[58] Field of Search ................................ 361/385, 386; 174/15 HD; 357/81, 82; 165/104.33; 363/144, 145

[56] References Cited

U.S. PATENT DOCUMENTS

| | | | |
|---|---|---|---|
| 3,586,959 | 6/1971 | Eccles | 357/82 X |
| 4,005,297 | 1/1977 | Cleaveland | 174/15 HD |
| 4,307,437 | 12/1981 | Severing | 363/145 X |
| 4,583,005 | 4/1986 | Bevans | 361/385 X |
| 4,614,964 | 9/1986 | Sutrina | 361/385 X |
| 4,628,219 | 12/1986 | Troscinski | 363/145 X |

Primary Examiner—A. D. Pellinen
Assistant Examiner—Jeffrey A. Gaffin
Attorney, Agent, or Firm—Jerry M. Presson; Walter C. Farley

[57] ABSTRACT

A diode assembly includes a base plate in which a plurality of diodes are mounted in a circle, uniformly spaced. A heat pipe within the diode circle extends perpendicular to the plate and is surrounded by radiating, heat-dissipating fins extending radially outwardly to support rings. Insulators mounted on these support rings support conductive straps which are connected through fuses to the other sides of the diodes. The assembly provides complete electrical and thermal symmetry for the diodes. Three such assemblies can be mounted on a single, triangular base plate.

3 Claims, 3 Drawing Figures

HEAT DISTRIBUTING DIODE MOUNTING ASSEMBLYSPECIFICATION

This invention relates to a diode mounting assembly in which a plurality of diodes are connected and mounted for good heat dissipation and distribution and for thermal and electrical symmetry. cl BACKGROUND OF THE INVENTION Systems for supplying direct current at high levels must either generate the direct current directly or must rectify alternating current. When rectification is used to supply, for example, an electric railway system, the rectification is accomplished by diodes which are connected in parallel. These diodes generate substantial amounts of heat and carry substantial amounts of current. It is therefore important to provide a mounting arrangement which is capable of dissipating the heat generated.

It is also highly desirable to mount the diodes so that each diode carries essentially the same amount of current as each other diode and so that the diodes are substantially in thermal equilibrium. If these conditions are not met, some diodes in the array carry more current than others and therefore have a significantly shorter life. A phenomenon known as thermal runaway can occur in which a diode is heated by the current it is carrying and the forward voltage drop of the diode is thereby reduced, increasing the current and further boosting the heating effect. This cycle can persist until the diode has essentially destroyed itself and commonly starts when one of a group of diodes initially carries more current than the others in that group. It has been found that, while heat dissipation in a diode array is important, the even distribution of heat between diodes connected in parallel can be even more important.

SUMMARY OF THE INVENTION

Accordingly, an object of the present invention is to provide a mounting arrangement for an array of diodes in which heat is efficiently distributed and dissipated.

A further object is to provide such a mounting arrangement in which heat is conducted well between diodes and removed from the diodes in a substantially equal manner and so that the current handled by the diodes is substantially uniform, thereby attaining a condition of thermal and electrical symmetry within the array and lengthening the useful life thereof.

Briefly described, the invention includes a diode array assembly including a thermally and electrically conductive base plate and a heat pipe comprising a thermally conductive cylindrical tube mounted on the base plate and extending perpendicularly therefrom. A plurality of diodes are mounted on the base plate, one end of each diode being attached to the base plate in good heat conducting relationship with the plate, the diodes being uniformly spaced apart on a circle concentrically surrounding the heat pipe. A plurality of thermally conductive fins protrude radially from the heat pipe, one edge of each of the fins being fixedly attached in good heat transfer relationship with the heat pipe. A number of support rings are attached to the radial outer edges of the fins to hold the outer edges in a substantially uniformly spaced relationship. A plurality of elongated electrically conductive bars, equal in number to the number of diodes, are attached to the rings by insulators in a substantially uniformly spaced arrangement around the heat pipe. Each diode is connected to one end of one of the conductive bars, the other ends of the bars being electrically connected to each other, thereby placing the diodes in an electrically parallel and thermally symmetrical relationship.

BRIEF DESCRIPTION OF THE DRAWINGS

In order to impart full understanding of the manner in which these and other objects are attained in accordance with the invention, a particularly advantageous embodiment thereof will be described with reference to the accompanying drawings, which form a part of this specification, and wherein.

DESCRIPTION OF THE PREFERRED EMBODIMENT

Figure 1:
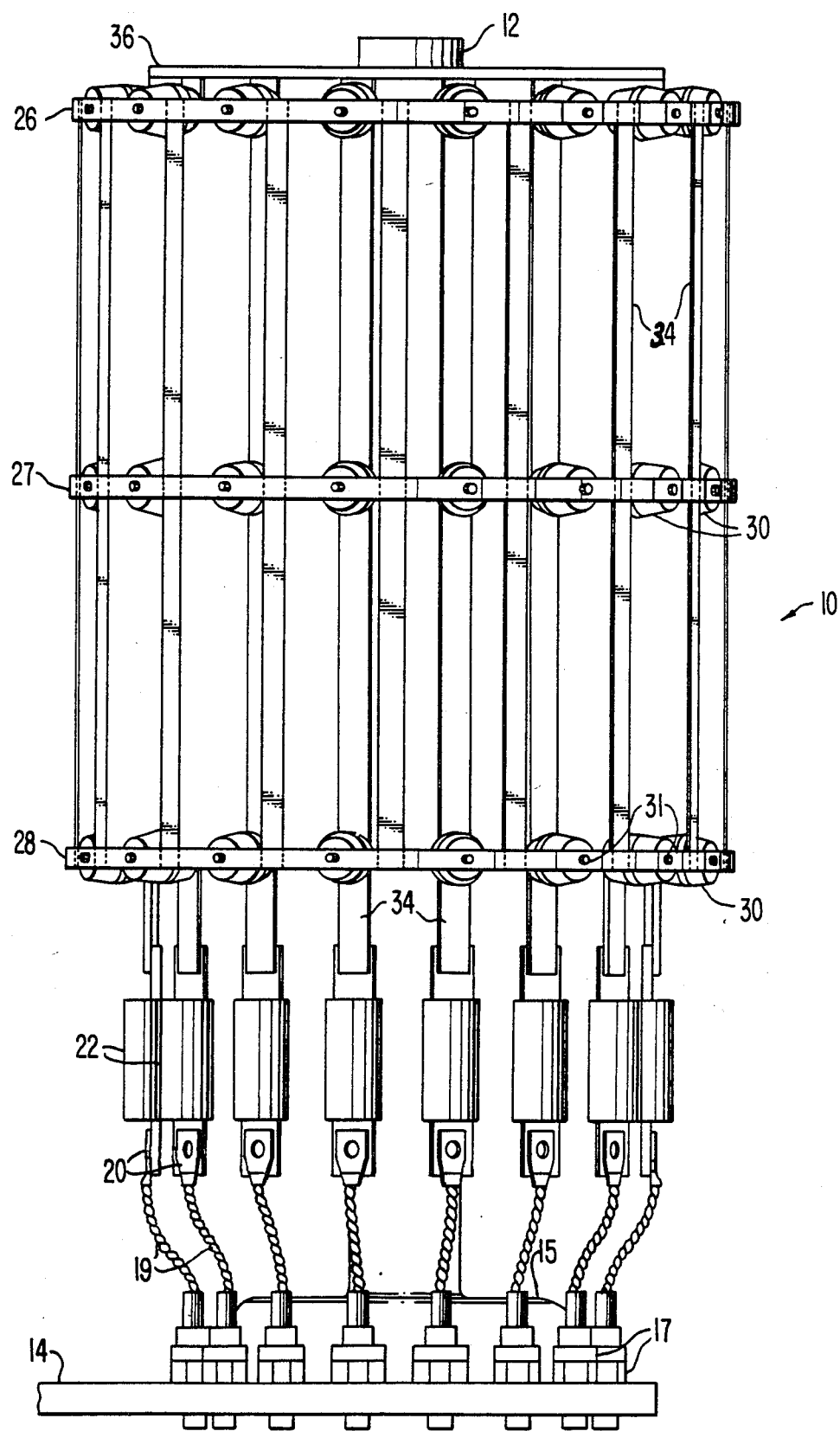
FIG. 1 is a side elevation of one unit of a diode mounting assembly in accordance with the invention.
Figure 2:
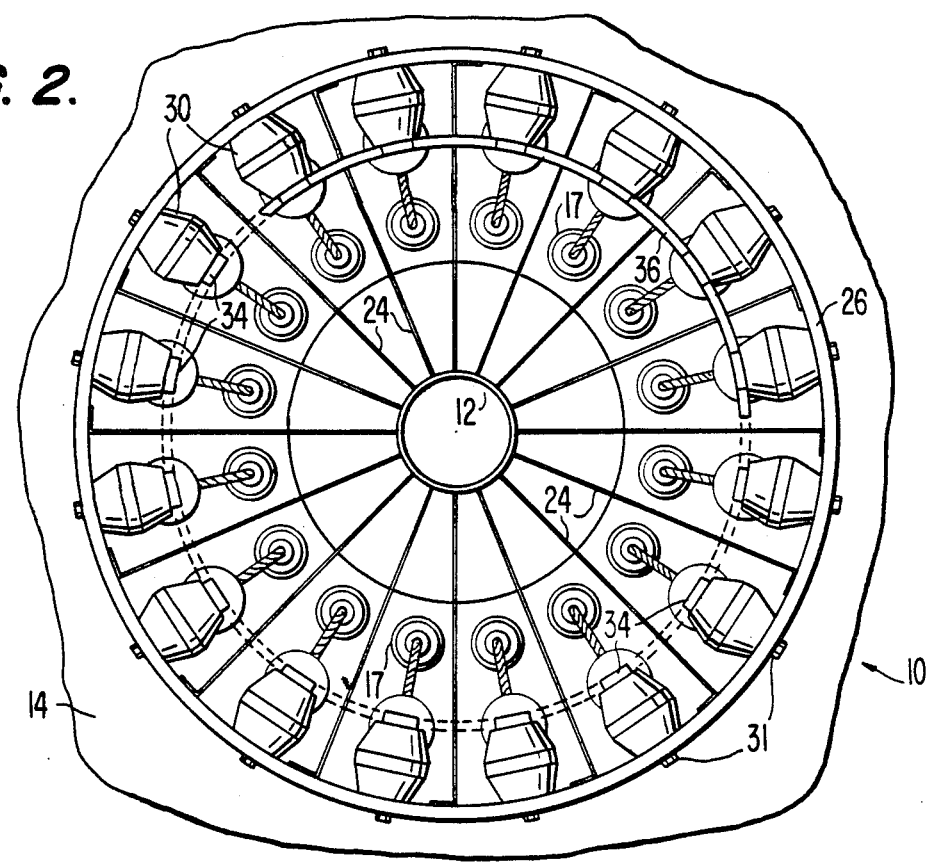
FIG. 2 is a top plan view of the assembly of Fig. 1.

FIGS. 1 and 2 show a diode assembly indicated generally at 10 in which a central heat pipe 12 is mounted on a base plate 14, only a portion of the base plate being shown in these figures. Base plate 14 is preferably made of a material such as copper, which is an excellent heat conductor as well as an excellent conductor of electricity. Similarly, heat pipe 12 is made of a good thermal conductor, such as copper, and is formed in a uniform cylindrical, tubular shape. The lower portion 15 of the heat pipe is enlarged to provide a solid base for the mounting of the heat pipe on plate 14 but, more importantly, to provide a circle of appropriately enlarged diameter near which the diodes can be mounted.

A plurality of substantially identical diodes 17 are fixedly attached to plate 14 in a circular array and are uniformly spaced apart around that circle. The diameter of the circle is chosen so that the diodes are as close as reasonably possible to the periphery of the enlarged portion 15 of heat pipe 12. It will be observed that in the embodiment shown the lower ends of the diodes are in both electrical and thermal contact with plate 14.

In this connection, plate 14 can be constructed with recesses to receive the lower end of the heat pipe and also the lower ends of the diodes, thereby improving not only the electrical but also the physical, mechanical connection of these devices with the plate. The upper end of each diode is connected to a relatively short electrical cable 19 which has a connector 20 at its upper end for connection to the lower end of a fuse 22. A plurality of such fuses, equal in number to the number of diodes, is mounted in a circular array, again maintaining the symmetry of the entire arrangement.

As best seen in FIG. 2, a plurality of generally rectangular, thermally conductive fins 24 are fixedly attached to the outer surface of heat pipe 12 and extend radially outwardly therefrom, the outer distal edges of the fins being bent into an L-shape and fixedly attached to three rings 26, 27, and 28. Rings 26-28 are brazed, riveted or otherwise securely attached to the ends of the fins, thereby maintaining the fins in a uniformly spaced relationship from each other and interconnecting this portion of the assembly in a rigid fashion, again maintaining the symmetry thereof.

A plurality of insulators 30 are mounted on the rings, one such insulator being centrally disposed between each two adjacent fins on each one of rings 26-28. Each insulator, which is preferably made of a nonconductive and heat-resistant material such as ceramic, is provided with fastening means at opposite ends such as an internally threaded bushing permanently formed or fixedly attached in the end of the insulator to receive a threaded bolt 31 or the like so that the insulator is firmly connected to its respective ring. At the other end of each insulator is a similar connection scheme.

A plurality of elongated conductive members 34, which can be in the shape of bars or straps, are mounted on the inner ends of the insulators, each bar 34 being attached to three such insulators and extending parallel with the axis of heat pipe 12. The lower end of each bar 34 extends below the insulators mounted on ring 28 and is connected to the upper end of a fuse 22. The upper ends of straps 34 are connected together mechanically and electrically by a washer-like ring 36 which is also electrically conductive.

At this connection point it is possible to provide alternative connection arrangements without disturbing the thermal symmetry. In a 16 diode array such as that shown, it may be desirable to have two sets of eight diodes which are connected together at one end but the other ends of which are electrically connected to two different circuit locations. It is also possible to make such connections with diodes of opposite polarity. With the arrangement shown, alternate ones of straps 34 can be made longer and connected to one ring 36 and the intermediate straps can be bent inwardly and attached to another ring. The longer straps can be connected to diodes of opposite polarity from those attached to the shorter straps. The rings can then be connected elsewhere using cables. Those skilled in the art will recognize various connection possibilities in, for example, three-phase bridges with various numbers of diodes.

It will be observed that plate 14, heat pipe 12, 15, fins 24 and rings 26-28 are all electrically on one side of the array of diodes. On the other side, electrically, of the diodes are cables 19, fuses 22, and straps 34, these components being electrically isolated from the first-named components by insulators 30.

The configuration thus described gives complete thermal and electrical symmetry. Diodes connected in parallel are mounted symmetrically in close proximity to heat pipe 12, and particularly to the enlarged lower portion 15 thereof. The heat pipe at the center of the circumferentially disposed diodes recovers the concentrated heat therefrom and transfers it to the dissipating fins. The heat pipe presents a very low thermal impedance between the parallel connected diodes, permitting heat flow between the diodes as well as to the dissipating fins. The straps 34 act as symmetrical buses which feed the diodes individually and act as ballasts to force current sharing between the diodes. Thus, electrical symmetry is also maintained.

The result is that the diodes are subjected to substantially identical electrical and thermal stresses, minimizing the likelihood that one or a few of the diodes will be overstressed and caused to fail prematurely.

Figure 3:
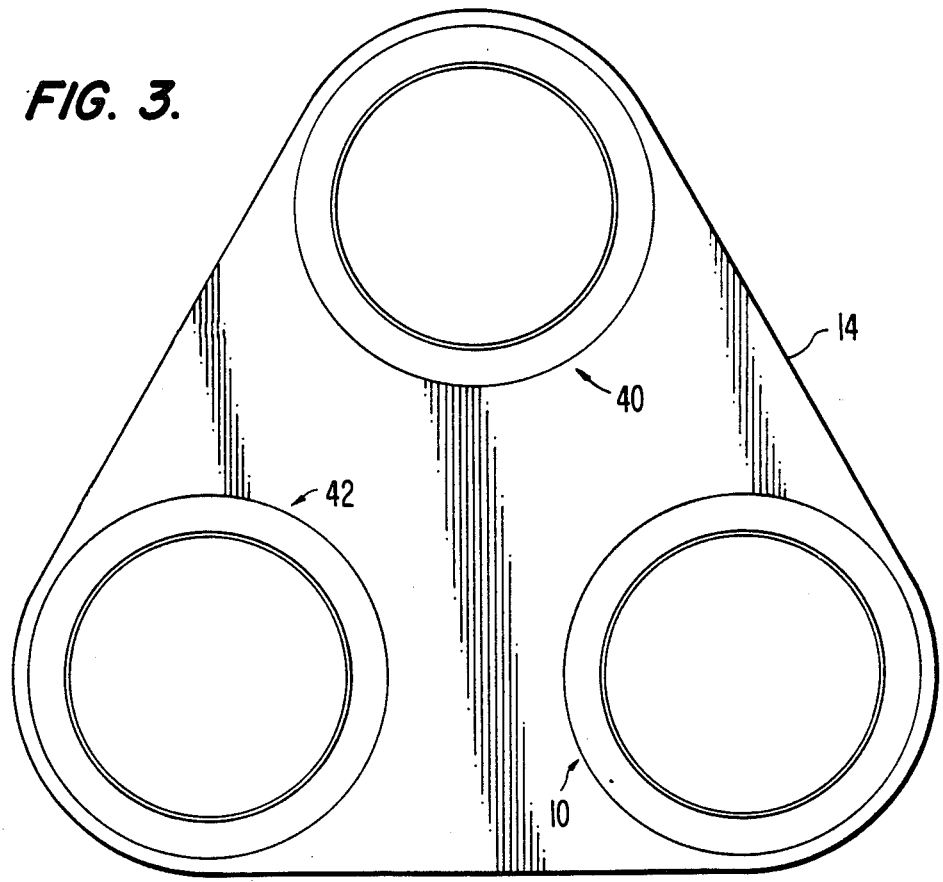
FIG. 3 is a top plan view of three assemblies such as shown in FIGS. 1 and 2 mounted on a single base plate.

FIG. 3 shows an overall view of an arrangement in which a diode assembly indicated generally at 10 is mounted on a base plate 14 along with two other substantially identical diode assemblies 40 and 42. Plate 14 is in a generally triangular shape with the three assemblies at the vertices thereof, allowing the three assemblies to be connected in parallel while maintaining the symmetry discussed above. With each assembly having 16 diodes, as in the illustrated embodiment, the total assembly has 48 diodes connected in the desired relationship.

Two such assemblies can be connected together to form a three-phase, full-wave bridge which would then have a total of 96 diodes. In this kind of arrangement oppositely polarized diodes would be used for each plate, one becoming positive and the other negative. Three assemblies can be interconnected to form a bridge having three levels. Using 15 diodes per assembly and two diode units per section of the bridge, each would have 30 diodes.

While one advantageous embodiment has been chosen to illustrate the invention, it will be understood by those skilled in the art that various changes and modifications can be made therein without departing from the scope of the invention as defined in the appended claims.

What is claimed is:
1. A diode array assembly comprising
  a thermally and electrically conductive base plate;
  a heat pipe comprising a thermally conductive cylindrical tube mounted on said base plate and extending perpendicularly therefrom;
  a plurality of diodes mounted on said base plate one end of each of said diodes being attached to said base plate in good electrical and heat conduction relationship therewith, said diodes being symmetrically spaced apart on a circle concentrically and closely surrounding said heat pipe;
  a plurality of thermally conductive fins protruding radially from said heat pipe, one edge of each of said fins being fixedly attached in good heat transfer relationship with said heat pipe;
  a plurality of elongated electrically conductive members;
  insulator means mounting said conductive members in a substantially symmetrical arrangement around said heat pipe; and
  first circuit means electrically connecting each said diode to an end of one of said conductive members.
2. A diode array according to claim 1 wherein said first circuit means includes a plurality of fuses equal in number to the number of diodes, one of said fuses being connected between each diode and an associated elongated member.
3. A diode array according to claim 2 and further including second circuit means for electrically connecting the other ends of said conductive members to each other, thereby placing said diodes in parallel relationship.

* * * * *